(12) United States Patent
Itai

(10) Patent No.: US 8,017,254 B2
(45) Date of Patent: Sep. 13, 2011

(54) ORGANIC ELECTROLUMINESCENCE DEVICE

(75) Inventor: Yuichiro Itai, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 982 days.

(21) Appl. No.: 11/713,027

(22) Filed: Mar. 2, 2007

(65) Prior Publication Data

US 2007/0205411 A1     Sep. 6, 2007

(30) Foreign Application Priority Data

Mar. 6, 2006 (JP) .................................. 2006-060246

(51) Int. Cl.
*H01L 51/54* (2006.01)

(52) U.S. Cl. ........ 428/690; 428/917; 313/504; 313/506; 252/301.16; 257/40; 257/88; 257/90; 257/E51.022

(58) Field of Classification Search ............... 257/90, 257/E51.019

See application file for complete search history.

(56) References Cited

U.S. PATENT DOCUMENTS

| | | | |
|---|---|---|---|
| 6,107,734 | A | 8/2000 | Tanaka et al. |
| 6,872,472 | B2 | 3/2005 | Liao et al. |
| 2003/0170491 | A1 | 9/2003 | Liao et al. |
| 2003/0189401 | A1 | 10/2003 | Kido et al. |
| 2005/0029933 | A1 | 2/2005 | Liao et al. |
| 2006/0008740 | A1 | 1/2006 | Kido et al. |
| 2006/0040132 | A1* | 2/2006 | Liao et al. ............... 428/690 |
| 2006/0263629 | A1* | 11/2006 | Aziz et al. ............... 428/690 |

FOREIGN PATENT DOCUMENTS

| | | |
|---|---|---|
| JP | 11-329748 A | 11/1999 |
| JP | 2003-45676 A | 2/2003 |
| JP | 2003-272860 A | 9/2003 |
| JP | 2004-39617 A | 2/2004 |
| JP | 2006-24791 A | 1/2006 |

OTHER PUBLICATIONS

Japanese Office Action with English translation dated Apr. 12, 2011, for Application No. 2006-060246.

\* cited by examiner

*Primary Examiner* — Callie E Shosho
*Assistant Examiner* — Michael H Wilson
(74) *Attorney, Agent, or Firm* — Birch, Stewart, Kolasch & Birch, LLP

(57) ABSTRACT

An organic electroluminescence device of multi-photon emission mode which includes plural light emission layers and at least one charge generation layer between a pair of electrodes, arranged in a film thickness direction thereof, wherein the charge generation layer includes at least one p-doped layer and at least one n-doped layer, and further includes an alkali metal layer and a layer containing a hole transport material between the p-doped layer and the n-doped layer. An organic electroluminescence device of multi-photon emission mode exhibiting little unevenness in luminance even in a large-area format electroluminescence device is provided.

11 Claims, No Drawings

ORGANIC ELECTROLUMINESCENCE DEVICE

CROSS-REFERENCE TO RELATED APPLICATION

This application claims priority under 35 USC 119 from Japanese Patent Application No. 2006-60246, the disclosure of which is incorporated by reference herein.

BACKGROUND OF THE INVENTION

1. Field of the Invention

The invention relates to an organic electroluminescence device which obtains high-luminance and reduced unevenness in luminance, and in particular, to an organic electroluminescence device of multi-photon emission mode, showing little unevenness in luminance even in a large-area format electroluminescence device.

2. Description of the Related Art

Organic electroluminescence devices (which are referred to hereinafter as an "organic EL device" in some cases) containing a thin film material that emits light by excitation due to application of electric current are known. The organic electroluminescence devices, which obtain high-luminance light emission at low voltage, have broad potential applications in fields such as cellular phone displays, personal digital assistants (PDA), computer displays, car information displays, TV monitors, and general illumination, and also have advantages of reducing the thickness, weight, size, and power consumption of the devices in the respective fields. Accordingly, such devices are greatly expected to become the leading devices in the future electronic display market. However, there are still many technical problems to overcome, such as with respect to luminance and color tone, durability under various ambient operating conditions, and mass productivity at low cost, in order for these devices to be practically used in these fields in place of conventional display devices.

Even higher luminance is needed, depending on the application. Various studies aimed at improvement in the quantum efficiency of luminescence devices and development of a method of extracting emitted light outward at high efficiency are now in progress for improvement in luminance.

Japanese Patent Application Laid-Open (JP-A) Nos. 2003-272860 and 2004-39617 disclose, as a means for increasing luminance, a device of multi-photon emission mode which includes plural laminated light emission layers (each light emission layer is referred to hereinafter as a "unit light emission layer" in some cases), wherein the unit light emission layers each independently include a light emission layer and an auxiliary layer, and are connected to each other by a charge generation layer. The charge generation layer includes an electric insulating layer formed by an n-doped layer and a p-doped layer. However, in a case where an electric insulating layer is provided as the charge generation layer, a loss of electroluminescent quantum yield with respect to current is unavoidable, and thus results in a disadvantage of lowering emission luminance. Also, an unevenness in the luminance induced by a voltage drop increases and presents a major problem particularly in the case of preparing a large-area format electroluminescence device.

Also, JP-A Nos. 11-329748 and 2003-45676 disclose a structure including an electrically conductive layer as the charge generation layer. However, it is difficult, in such a structure, to exhibit a sufficient multi-photon emission effect.

SUMMARY OF THE INVENTION

The present invention has been made in view of the above circumstances and provides an organic electroluminescence device of multi-photon emission mode which comprises plural light emission layers and at least one charge generation layer between a pair of electrodes, arranged in a film thickness direction thereof, wherein the charge generation layer includes at least one p-doped layer and at least one n-doped layer, and further includes an alkali metal layer and a layer containing a hole transport material between the p-doped layer and the n-doped layer.

DETAILED DESCRIPTION OF THE INVENTION

An object of the present invention is to provide an organic electroluminescence device of multi-photon emission mode, having a high luminance and reduced unevenness in luminance, and more particularly to provide an organic electroluminescence device of multi-photon emission mode, exhibiting little unevenness in luminance even in a large-area format electroluminescence device.

The organic electroluminescence device of the present invention is an organic electroluminescence device of multi-photon emission mode which comprises plural light emission layers and at least one charge generation layer between a pair of electrodes, arranged in a film thickness direction thereof, wherein the charge generation layer includes at least one p-doped layer and at least one n-doped layer, and further includes an alkali metal layer and a layer containing a hole transport material between the p-doped layer and the n-doped layer.

The alkali metal layer preferably contains a metal selected from Li, Na, K, Rb or Cs, and more preferably contains Li.

The layer containing the hole transport material preferably contains an aromatic tertiary amine compound, and more preferably contains 4,4',4"-tri-(2-naphthylphenylamino)-triphenylamine (which is referred to hereinafter as "2-TNATA" in some cases). More preferably, the alkali metal layer contains Li, and the layer containing the hole transport material contains 2-TNATA.

The p-doped layer preferably contains an arylamine compound represented by the following formula (I).

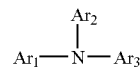

Formula (I)

Ar1, Ar2 and Ar3 in the formula (I) each independently represent an aromatic hydrocarbon group that may have a substituent.

The arylamine compound represented by the formula (I) preferably has a glass transition point of 90° C. or higher.

The n-doped layer preferably contains a metal oxide or an organic compound containing a fluorine atom or a cyano group as a substituent.

An organic electroluminescence device having a high luminance and reduced unevenness in luminance is provided. More particularly, an organic electroluminescence device of multi-photon emission mode exhibiting little unevenness in luminance even in a large-area format electroluminescence device is provided.

In the following, the organic electroluminescence device of the present invention will be described in detail.

(Constitution)

As a lamination pattern of the organic compound layers of the organic EL device in the present invention, it is preferable that one emission unit comprises layers laminated in the order of a positive hole-transport layer, a light-emitting layer, and an electron-transport layer from the anode side, and multiple emission units are laminated. Moreover, a positive hole-transporting intermediate layer between the positive hole-transport layer and the light-emitting layer, and/or an electron transporting intermediate layer between the light-emitting layer and the electron-transport layer may be provided. Further, a positive hole-injection layer may be provided in between the anode and the positive hole-transport layer, and similarly an electron-injection layer may be provided in between the cathode and the electron-transport layer. An electric charge generation layer is provided between the emission units.

(Charge Generation Layer)

A charge generation layer means a layer capable of causing a redox reaction in the layer due to application of electric current, thereby generating a radical cation and a radical anion.

The charge generation layer according to the present invention has a laminated film or mixed layer of two kinds of different substances, wherein a charge-transfer complex comprising a radical cation and a radical anion is formed by an oxidation-reduction reaction between the two kinds of substances, and the radical cation species and the radical anion species in the charge-transfer complex migrate respectively in the directions toward the cathode and anode due to application of voltage, whereby holes are injected into the emission unit in contact with the cathode side of the charge generation layer and electrons are injected into the emission unit in contact with the anode side of the charge generation layer.

The charge generation layer in the present invention includes at least a layer (p-doped layer) containing an organic compound having hole transportability, namely, an electron-donating property, and a layer (n-doped layer) containing an inorganic or organic material forming a charge-transfer complex with the organic compound having hole transportability through an oxidation-reduction reaction.

1) P-Doped Layer

<Material>

The p-doped layer includes an organic compound having hole transportability, namely, an electron-donating property, preferably having an ionization potential of lower than 5.7 eV.

A specific example of the organic compound employed in p-doped layer in the present invention is an arylamine compound represented by formula (I).

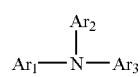

Formula (I)

In the formula (I), $Ar_1$, $Ar_2$ and Ar3 each independently represent an aromatic hydrocarbon group that may be substituted. Preferably, the organic compound is an arylamine compound having a glass transition point of 90° C. or higher.

Specific examples of the arylamine compound include N,N'-dinaphthyl-N,N'-diphenyl-[1,1'-biphenyl]-4,4'-diamine (which is referred to hereinafter as "α-NPD" in some cases), 4,4',4"-tri-(2-naphthylphenylamino)-triphenylamine (which is referred to hereinafter as "2-TNATA" in some cases), 2,2,7,7'-tetrakis-(N,N'-diphenylamino)-9,9-spirobifluoren (which is referred to hereinafter as "spiro-TAD" in some cases), N,N'-bis(naphthalene-1-yl)-N,M'-bis(phenyl)-spiro (which is referred to hereinafter as "spiro-NPB" in some cases), and the like.

<Arrangement of Layer>

In the present invention, the p-doped layer is preferably provided adjacent to any one of the plural light emission layers.

<Layer Thickness>

The p-doped layer in the present invention preferably has a thickness of from 1 to 100 nm, and more preferably from 10 to 50 nm. The thickness of the p-doped layer in the invention may be adjusted to a desired value, by regulating the deposition conditions.

In the present invention, a thickness exceeding this range results in disadvantages of a decrease in driving durability accompanying heat generation and a loss of light emission efficiency. A thickness less than this range results in a disadvantage in that the layer becomes incapable of functioning as a layer.

A component forming the p-doped layer in the present invention is an inorganic material or an organic material.

The inorganic material is preferably a metal halide or a metal oxide, and more preferably a metal halide. Specific examples of the metal oxide include $V_2O_5$ (vanadium pentoxide) and $Re_2O_7$ (rhenium heptoxide).

The layer of the inorganic material is preferably formed by resistance-heating deposition, electron-beam deposition or laser-beam deposition. Particularly preferably, the layer of the inorganic material is formed by sputtering, and the sputtering apparatus used therefore is a target-facing sputtering apparatus having reflection electrodes reflecting electrons placed in front of a pair of targets facing each other that are separated by a certain distance and a magnetic field-generating means generating a parallel magnetic field having a component parallel to the target face in the area close to the periphery of each target.

The organic material for the p-doped layer is preferably an electron-injecting or electron-accepting compound having at least one fluorine as a substituent or an electron injecting or electron accepting compound having at least one cyano group as a substituent group. Specific examples of the organic material for the charge generation layer include tetra-fluoro-tetracyano -quinodimethane (which is referred to hereinafter as "F4-TCNQ" in some cases).

2) n-doped layer

<Arrangement of layer>

In the present invention, the n-doped layer is preferably provided adjacent to any one of the light emission layers which is different from a light emitting layer that is adjacent to the p-doped layer.

<Layer Thickness>

The n-doped layer in the present invention preferably has a thickness of from 1 to 100 nm, and more preferably from 10 to 50 nm. The thickness of the n-doped layer in the invention may be adjusted to a desired value, by regulating the deposition conditions.

In the present invention, a thickness exceeding this range results in disadvantages of a decrease in driving durability accompanying heat generation and a loss of light emission efficiency. A thickness less than this range results in a disadvantage in that the layer becomes incapable of functioning as a layer.

(Alkali Metal Layer)

<Material>

The alkali metal layer in the present invention preferably includes a metal selected from the group consisting of Li, Na, K, Rb and Cs. More preferably, the alkali metal is Li.

<Layer Arrangement>

The alkali metal layer in the present invention is preferably provided adjacent to a surface of the p-doped layer, opposite to a surface thereof that is adjacent to the light emission layer.

<Layer Thickness>

In the present invention, the alkali metal layer preferably has a thickness of from 0.1 to 10 nm, and more preferably from 1 to 10 nm. The thickness of the alkali metal layer in the invention may be adjusted to a desired value, by regulating the deposition conditions.

In the invention, a thickness exceeding this range results in a disadvantage of a decrease in light emission efficiency caused by a decrease in the optical transmittance of the layer, and a thickness less than this range results in a disadvantage in that the layer becomes incapable of functioning as a layer.

(Layer Containing Hole Transport Material)

<Material>

A hole transport material to be employed in the layer containing the hole transport material of the invention may be selected from the materials which will be explained as a hole transport material for use in a hole transport layer to be explained later.

The hole transport material is preferably an aromatic tertiary amine compound, and more preferably is 2-TNATA.

<Layer Arrangement>

The layer containing the hole transport material in the invention is preferably provided adjacent to a surface of the n-doped layer, opposite to a surface thereof adjacent to the light emission layer.

<Layer Thickness>

The layer containing the hole transport material in the invention preferably has a thickness of from 1 to 100 nm, more preferably from 10 to 50 nm. The thickness of the layer containing the hole transport material of the invention may be adjusted to a desired value, by regulating the deposition conditions.

(Other Organic Layers)

The preferred constructions of the emission unit comprising the organic compound layers in the organic electroluminescence device of the present invention are as follows. (1) An embodiment having a positive hole-injection layer, a positive hole-transport layer (the positive hole-injection layer may also serve as the positive hole-transport layer), a positive hole transporting intermediate layer, a light-emitting layer, an electron-transport layer, and an electron-injection layer (the electron-transport layer may also has a role of the electron-injection layer) in this order from the anode side; (2) an embodiment having positive hole-injection layer, a positive hole-transport layer (the positive hole-injection layer may also has a role of the positive hole-transport layer), a light-emitting layer, an electron transporting immediate layer, an electron-transport layer, and an electron-injection layer (the electron-transport layer may also serve as the electron-injection layer); and (3) an embodiment having a positive hole-injection layer, a positive hole-transport layer (the positive hole-injection layer may also serve as the positive hole-transport layer), a positive hole transporting intermediate layer, a light-emitting layer, an electron transporting intermediate layer, an electron-transport layer, and an electron-injection layer (the electron-transport layer may also serve as the electron-injection layer).

The above-described positive hole transporting intermediate layer preferably has at least either a function for accelerating the injection of positive holes into the light-emitting layer, or a function for blocking electrons.

Furthermore, the above-described electron transporting intermediate layer preferably has at least either a function for accelerating the injection of electrons into the light-emitting layer, or a function for blocking positive holes.

Moreover, at least either one of the above-described positive hole transporting intermediate layer and the electron transporting intermediate layer preferably has a function for blocking excitons produced in the light-emitting layer.

In order to effectively realize the functions for accelerating the injection of positive holes, or the injection of electrons, and the functions for blocking positive holes, electrons, or excitons, it is preferred that the positive hole transporting intermediate layer and the electron transporting intermediate layer are adjacent to the light-emitting layer.

The respective layers mentioned above may be divided into a plurality of secondary layers.

Next, the components constituting the electroluminescence device of the present invention will be described in detail.

(Formation of Organic Compound Layer)

In the organic electroluminescence device of the present invention, the respective layers constituting the organic compound layers can be suitably formed in accordance with any of a dry film-forming method such as a vapor deposition method, or a sputtering method; a transfer method; a printing method; a coating method; an ink-jet printing method; or a spray method.

(Positive Hole-Injection Layer and Positive Hole-Transport Layer)

The positive hole-injection layer and positive hole-transport layer correspond to layers functioning to receive positive holes from an anode or from an anode side and to transport the positive holes to a cathode side.

As an electron-accepting dopant to be introduced into a positive hole-injection layer or a positive hole-transport layer, either of an inorganic compound or an organic compound may be used as long as the compound has electron accepting property and a function for oxidizing an organic compound. Specifically, Lewis acid compounds such as ferric chloride, aluminum chloride, gallium chloride, indium chloride, and antimony pentachloride are preferably used as the inorganic compounds.

In case of the organic compounds, compounds having substituents such as a nitro group, a halogen, a cyano group, or a trifluoromethyl group; quinone compounds, acid anhydride compounds, and fullerenes may be preferably applied.

Specific examples of the organic compounds include hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, tetramethylbenzoquinone, 1,2,4,5-tetracyanobenzene, o-dicyanobenzene, p-dicyanobenzene, 1,4-dicyanotetrafluorobenzene, 2,3-dichloro-5,6-dicyanobenzoquinone, p-dinitrobenzene, m-dinitrobenzene, o-dinitrobenzene, p-cyanonitrobenzene, m-cyanonitrobenzene, o-cyanonitrobenzene, 1,4-naphthoquinone, 2,3-dichloronaphthoquinone, 1-nitronaphthalene, 2-nitronaphthalene, 1,3-dinitronaphthalene, 1,5-dinitronaphthalene, 9-cyanoanthoracene, 9-nitroanthracene, 9,10-anthraquinone, 1,3,6,8-tetranitrocarbazole, 2,4,7-trinitro-9-fluorenone, 2,3,5,6-tetracyanopyridine, maleic anhydride, phthalic anhydride, fullerene C60, and fullerene C70.

Among these, hexacyanobutadiene, hexacyanobenzene, tetracyanoethylene, tetracyanoquinodimethane, tetrafluorotetracyanoquinodimethane, p-fluoranil, p-chloranil, p-bromanil, p-benzoquinone, 2,6-dichlorobenzoquinone, 2,5-dichlorobenzoquinone, 1,2,4,5-tetracyanobenzene, 1,4-dicyanotetrafluorobenzene, 2,3-dichloro-5,6- dicyanobenzoquinone, p-dinitrobenzene, m-dinitrobenzene, o-dinitrobenzene, 1,4-naphthoquinone, 2,3-dichloronaphthoquinone, 1,3-dinitronaphthalene, 1,5-dinitronaphthalene, 9,10-anthraquinone, 1,3,6,8-tetranitrocarbazole, 2,4,7-trinitro-9-fluorenone, 2,3,5,6-tetracyanopyridine, or fullerene C60 is preferable. Hexacyanobutadiene, hexacyanobenzene, tetracyanoethylene, tetracyanoquinodimethane, tetrafluorotetracyanoquinodimethane, p-fluoranil, p-chloranil, p-bromanil, 2,6-dichlorobenzoquinone, 2,5-dichlorobenzoquinone, 2,3-dichloronaphthoquinone, 1,2,4,5-tetracyanobenzene, 2,3-dichloro-5,6-dicyanobenzoquinone, or 2,3,5,6-tetracyanopyridine is particularly preferred.

These electron-accepting dopants may be used alone or in a combination of two or more of them.

Although an applied amount of these electron-accepting dopants depends on the type of material, 0.01% by mass to 50% by mass of a dopant is preferred with respect to a positive hole-transport layer material, 0.05% by mass to 20% by mass is more preferable, and 0.1% by mass to 10% by mass is particularly preferred. When the amount applied is less than 0.01% by mass with respect to the positive hole transportation material, it is not desirable because the advantageous effects of the present invention are insufficient, and when it exceeds 50% by mass, positive hole transportation ability is deteriorated, and thus, this is not preferred.

As a material for the positive hole-injection layer and the positive hole-transport layer, it is preferred to contain specifically pyrrole derivatives, carbazole derivatives, pyrazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted calcon derivatives, styrylanthracene derivatives, fluorenone derivatives, hydrazone derivatives, stilbene derivatives, silazane derivatives, aromatic tertiary amine compounds, styrylamine derivatives, aromatic dimethylidine compounds, porphyrin compounds, organosilane derivatives, carbon or the like.

Although a thickness of the positive hole-injection layer and the positive hole-transport layer is not particularly limited, it is preferred that the thickness is 1 mm to 5 μm, it is more preferably 5 nm to 1 μm, and 10 nm to 500 nm is particularly preferred in view of decrease in driving voltage, improvements in luminescent efficiency, and improvements in durability.

The positive hole-injection layer and the positive hole-transport layer may be composed of a monolayered structure comprising one or two or more of the above-mentioned materials, or a multilayer structure composed of plural layers of a homogeneous composition or heterogeneous compositions.

When the carrier transportation layer adjacent to the light-emitting layer is a positive hole-transport layer, it is preferred that the Ip (HTL) of the positive hole-transport layer is smaller than the Ip (D) of the dopant contained in the light-emitting layer in view of driving durability.

The Ip (HTL) in the positive hole-transport layer may be measured in accordance with the below-mentioned measuring method of Ip.

A carrier mobility in the positive hole-transport layer is usually from $10^{-7}$ $cm^2.V^{-1}.s^{-1}$ to $10^{-1}$ $cm^2.V^{-1}.s^{-1}$; and in this range, from $10^{-5}$ $cm^2.V^{-1}.s^{-1}$ to $10^{-1}$ $cm^2.V^{-1}.s^{-1}$ is preferable; from $10^{-4}$ $cm^2.V^{-1}.s^{-1}$ to $10^{-1}$ $cm^2.V^{-1}.s^{-1}$ is more preferable; and from $10^{-3}$ $cm^2.V^{-1}.s^{-1}$ to $10^{-1}$ $cm^2.V^{-1}.s^{-1}$ is particularly preferable in view of the luminescent efficiency.

For the carrier mobility, a value measured in accordance with the same method as that of the carrier mobility of the above-described light-emitting layer is adopted.

Moreover, it is preferred that the carrier mobility in the positive hole-transport layer is higher than that in the above-described light-emitting layer in view of driving durability and luminescent efficiency.

(Electron Injection Layer and Electron-Transport Layer)

The electron injection layer and the electron-transport layer are layers having any of functions for injecting electrons from the cathode, transporting electrons, and becoming a barrier to positive holes which could be injected from the anode.

As a material applied for the electron-donating dopant with respect to the electron injection layer or the electron-transport layer, any material may be used as long as it has an electron-donating property and a property for reducing an organic compound, and alkaline metals such as Li, alkaline earth metals such as Mg, and transition metals including rare-earth metals are preferably used.

Particularly, metals having a work function of 4.2 V or less are preferably applied, and specific examples thereof include Li, Na, K, Be, Mg, Ca, Sr, Ba, Y, Cs, La, Sm, Gd, and Yb.

These electron-donating dopants may be used alone or in a combination of two or more of them.

An applied amount of the electron-donating dopants differs dependent on the types of the materials, but it is preferably 0.1% by mass to 99% by mass with respect to an electron-transport layer material, more preferably 1.0% by mass to 80% by mass, and particularly preferably 2.0% by mass to 70% by mass. When the amount applied is less than 0.1% by mass, the efficiency of the present invention is insufficient so that it is not desirable, and when it exceeds 99% by mass, the electron transportation ability is deteriorated so that it is not preferred.

Specific examples of the materials applied for the electron injection layer and the electron-transport layer include pyridine, pyrimidine, triazine, imidazole, triazole, oxazole, oxadiazole, fluorenone, anthraquinodimethane, anthrone, diphenylquinone, thiopyrandioxide, carbodiimide, imide, fluorenylidenemethane, distyrylpyradine, fluorine-substituted aromatic compounds, naphthalene, heterocyclic tetracarboxylic anhydrides such as perylene, phthalocyanine, and the derivatives thereof (which may form condensed rings with the other rings); and metal complexes represented by metal complexes of 8-quinolinol derivatives, metal phthalocyanine, and metal complexes containing benzoxazole, or benzothiazole as the ligand.

Although a thickness of the electron injection layer and the electron-transport layer is not particularly limited, it is preferred that the thickness is in 1 nm to 5 μm, it is more preferably 5 nm to 1 μm, and it is particularly preferably 10 nm to 500 nm in view of decrease in driving voltage, improvements in luminescent efficiency, and improvements in durability.

The electron injection layer and the electron-transport layer may have either a monolayered structure comprising one or two or more of the above-mentioned materials, or a multilayer structure composed of plural layers of a homogeneous composition or a heterogeneous composition.

When the carrier transportation layer adjacent to the light-emitting layer is an electron-transport layer, it is preferred that the Ea (ETL) of the electron-transport layer is higher than the Ea (D) of the dopants contained in the light-emitting layer in view of driving durability.

For the Ea (ETL), a value measured in accordance with the same manner as the measuring method of Ea, which will be mentioned later, is used.

Furthermore, the carrier mobility in the electron-transport layer is usually from $10^{-7}$ $cm^2.V^{-1}.s^{-1}$ to $10^{-1}$ $cm^2.V^{-1}.s^{-1}$, and in this range, from $10^{-5}$ $cm^2.V^{-1}.s^{-1}$ to $10^{-1}$ $cm^2.V^{-1}.s^{-1}$ is preferable, from $10^{-4}$ cm$^2$.V$^{-1}$.s$^{-1}$ to $10^{-1}$ cm$^2$.V$^{-1}$.s$^{-1}$ is more preferable, and from $10^{-3}$ cm$^2$.V$^{-1}$.s$^{-1}$ to $10^{-1}$ cm$^2$.V$^{-1}$.s$^{-1}$ is particularly preferred, in view of luminescent efficiency.

Moreover, it is preferred that the carrier mobility in the electron-transport layer is higher than that of the light-emitting layer in view of driving durability. The carrier mobility is measured in accordance with the same method as that of the positive hole-transport layer.

As to the carrier mobility of the luminescent device of the present invention, it is preferred that the carrier mobility in the positive hole-transport layer, the electron-transport layer, and the light-emitting layer has the relationship of (electron-transport layer≧positive hole-transport layer)>light-emitting layer in view of driving durability.

As the host material contained in the buffer layer, the below-mentioned positive hole transporting host or electron transporting host may be preferably used.

(Light-Emitting Layer)

As the light-emitting layer in the present invention comprises plural light-emission units, the light-emission unit will be described in detail. A combination of the plural light-emission units are preferably selected from the constructions explained hereinafter.

The light-emitting layer is a layer having a function for receiving positive holes from the anode, the positive hole-injection layer, the positive hole-transport layer or the positive hole transporting buffer layer, and receiving electrons from the cathode, the electron injection layer, the electron-transport layer, or the electron transporting buffer layer, and for providing a field for recombination of the positive holes with the electrons to emit a light.

The light-emitting layer of the present invention contains at least one type of luminescent dopant and a plurality of host compounds.

The light-emitting layer may be composed of either one layer or two or more layers wherein the respective layers may emit light of different colors from one another in the respective layers. Even if the light-emitting layers are composed of a plurality thereof, it is preferred that each of the light-emitting layers contains at least one luminescent dopant and a plurality of host compounds.

The luminescent dopant and the plural host compounds contained in the light-emitting layer of the present invention may be either a combination of a fluorescence luminescent dopant in which the luminescence (fluorescence) from a singlet exciton is obtained and the plurality of host compounds, or a combination of a phosphorescence luminescent dopant in which the luminescence (phosphorescence) from triplet exciton is obtained and the plurality of host compounds; among these, a combination of the phosphorescence luminescent dopant and the plurality of host compounds is preferable in view of luminescent efficiency.

The light-emitting layer of the present invention may contain two or more types of luminescent dopants for improving color purity and expanding the luminescent wavelength region.

<<Luminescent Dopant>>

Any of phosphorescent emission materials, fluorescent emission materials and the like may be used as the luminescent dopant in the present invention.

It is preferred that the luminescent dopant in the present invention is one satisfying a relationship between the above-described host compound and the luminescent dopant of 1.2 eV>ΔIp>0.2 eV and/or 1.2 eV>ΔEa>0.2 eV in view of driving durability.

<<Phosphorescence Luminescent Dopant>>

Examples of the above-described phosphorescence luminescent dopant generally include complexes containing transition metal atoms or lantanoid atoms.

For instance, although the transition metal atoms are not limited, they are preferably ruthenium, rhodium, palladium, tungsten, rhenium, osmium, iridium, or platinum; more preferably rhenium, iridium, and platinum, or even more preferably iridium, or platinum.

Examples of the lantanoid atoms include lanthanum, cerium, praseodymium, neodymium, samarium, europium, gadolinium, terbium, dysprosium, holmium, erbium, thulium, ytterbium, and lutetium, and among these lantanoid atoms, neodymium, europium, and gadolinium are preferred.

Examples of ligands in the complex include the ligands described, for example, in "Comprehensive Coordination Chemistry" authored by G Wilkinson et al., published by Pergamon Press Company in 1987; "Photochemistry and Photophysics of Coordination compounds" authored by H. Yersin, published by Springer-Verlag Company in 1987; and "YUHKI KINZOKU KAGAKU —KISO TO OUYOU— (Metalorganic Chemistry—Fundamental and Application—)" authored by Akio Yamamoto, published by Shokabo Publishing Co., Ltd. in 1982.

Specific examples of the ligands include preferably halogen ligands (preferably chlorine ligands), aromatic carboxycyclic ligands (e.g., cyclopentadienyl anions, benzene anions, or naphthyl anions and the like), nitrogen-containing heterocyclic ligands (e.g., phenylpyridine, benzoquinoline, quinolinol, bipyridyl, or phenanthroline and the like), diketone ligands (e.g., acetylacetone and the like), carboxylic acid ligands (e.g., acetic acid ligands and the like), alcoholate ligands (e.g., phenolate ligands and the like), carbon monoxide ligands, isonitryl ligands, and cyano ligand, and more preferably nitrogen-containing heterocyclic ligands.

The above-described complexes may be either a complex containing one transition metal atom in the compound, or a so-called polynuclear complex containing two or more transition metal atoms wherein different metal atoms may be contained at the same time.

Among these, specific examples of the luminescent dopants include phosphorescence luminescent compounds described in patent documents such as U.S. Pat. Nos. 6,303,238B1, 6,097,147, WO 00/57676, WO 00/70655, WO 01/08230, WO 01/39234A2, WO 01/41512A1, WO 02/02714A2, WO 02/15645A1, WO 02/44189A1, JP-A No. 2001-247859, Japanese Patent Application No. 2000-33561, JP-A Nos. 2002-117978, 2002-225352, and 2002-235076, Japanese Patent Application No. 2001-239281, JP-A No. 2002-170684, EP 1211257, JP-A Nos. 2002-226495, 2002-234894, 2001-247859, 2001-298470, 2002-173674, 2002-203678, 2002-203679, and 2004-357791, Japanese Patent Application Nos. 2005-75340 and 2005-75341, etc. Among these, more preferable examples of the luminescent dopants include Ir complexes, Pt complexes, Cu complexes, Re complexes, W complexes, Rh complexes, Ru complexes, Pd complexes, Os complexes, Eu complexes, Tb complexes, Gd complexes, Dy complexes, and Ce complexes; particularly preferable are Ir complexes, Pt complexes, and Re complexes; and among these, Ir complexes, Pt complexes, and Re complexes each containing at least one coordination mode of metal-carbon bonds, metal-nitrogen bonds, metal-oxygen bonds, and metal-sulfur bonds are preferred.

<<Fluorescence Luminescent Dopant>>

Examples of the above-described fluorescence luminescent dopants generally include benzoxazole, benzoimidazole, benzothiazole, styrylbenzene, polyphenyl, diphenylbutadiene, tetraphenylbutadiene, naphthalimide, coumarin, pyran, perinone, oxadiazole, aldazine, pyralidine, cyclopentadiene, bis-styrylanthracene, quinacridone, pyrrolopyridine, thiadiazolopyridine, cyclopentadiene, styrylamine, aromatic dimethylidene compounds, condensed polyaromatic compounds (anthracene, phenanthroline, pyrene, perylene, rubrene, pentacene and the like), a variety of metal complexes represented by metal complexes of 8-quinolynol, pyromethene complexes or rare-earth complexes, polymer compounds such as polythiophene, polyphenylene or polyphenylenevinylene, organic silanes, and derivatives thereof.

Among these, specific examples of the luminescent dopants include the following compounds, but it should be noted that the present invention is not limited thereto.

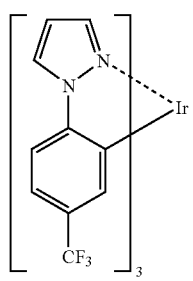

D-1

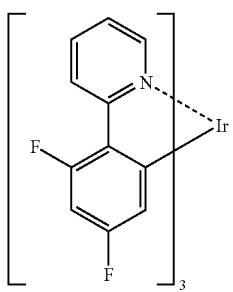

D-2

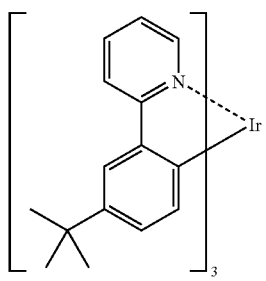

D-3

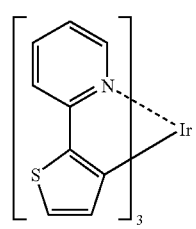

D-4

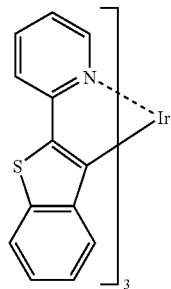

D-5

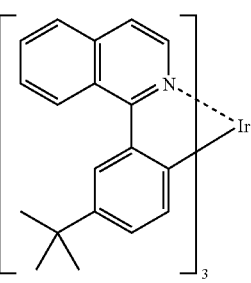

D-6

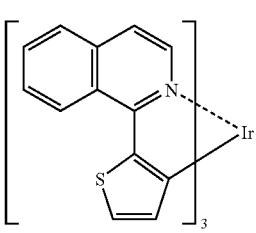

D-7

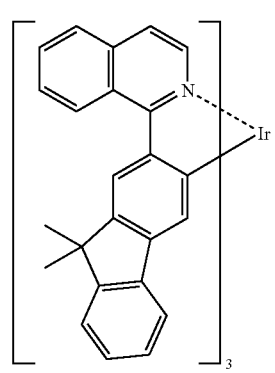

D-8

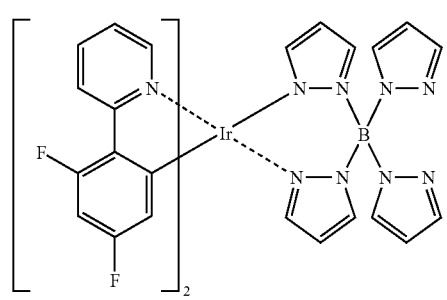

D-9

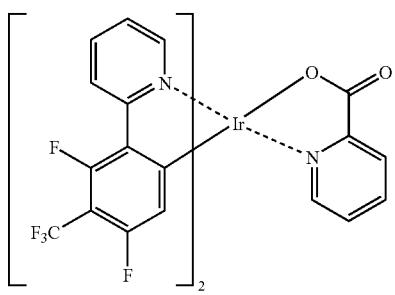
D-10
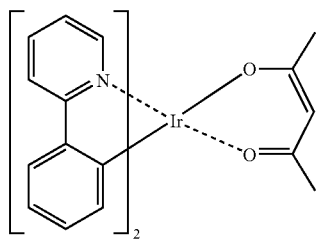
D-11
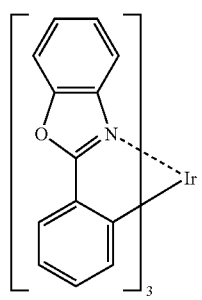
D-12
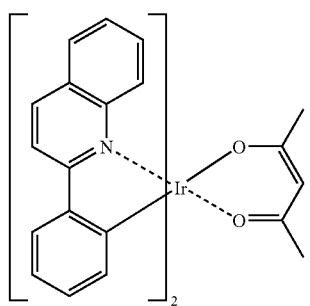
D-13
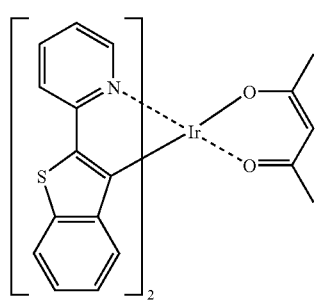
D-14
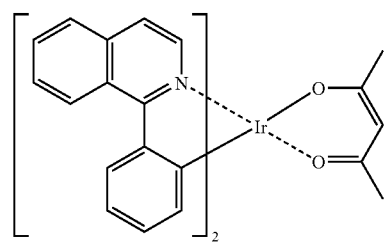
D-15
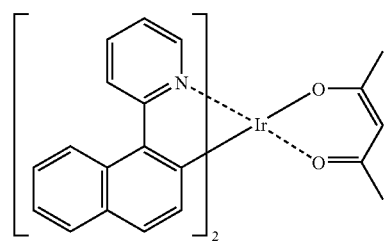
D-16
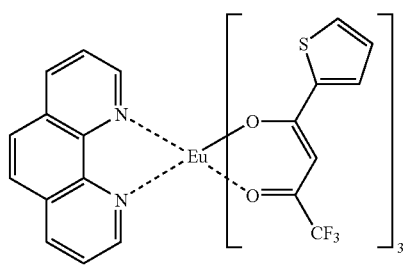
D-17
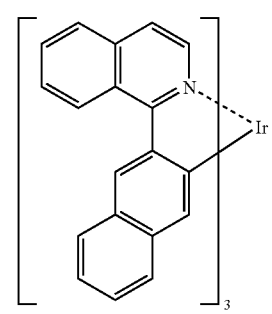
D-18
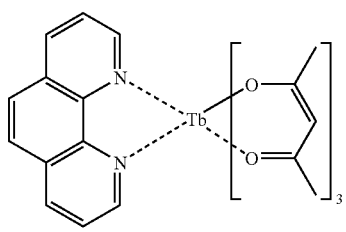
D-19
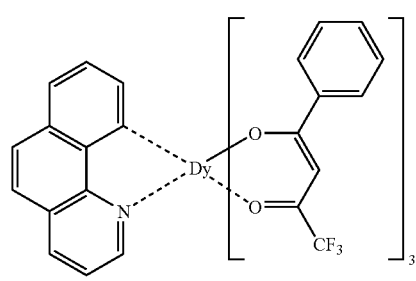
D-20

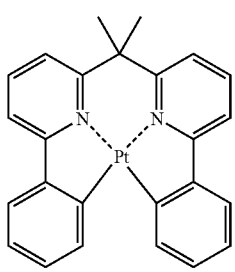

D-21

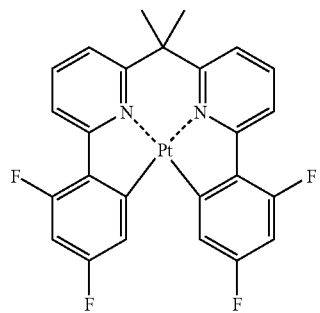

D-22

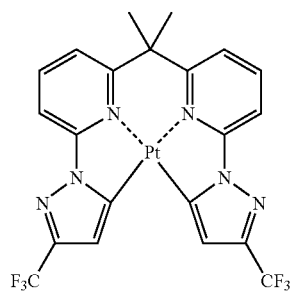

D-23

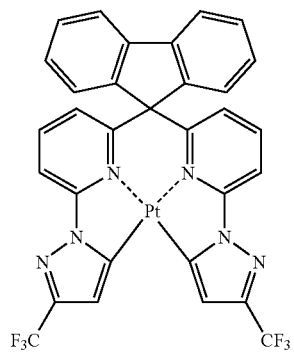

D-24

Among the above-described compounds, as the luminescent dopants to be used according to the present invention, D-2, D-3, D-4, D-5, D-6, D-7, D-8, D-9, D-10, D-11, D-12, D-13, D-14, D-15, D-16, D-21, D-22, D-23, or D-24 is preferable, D-2, D-3, D-4, D-5, D-6, D-7, D-8, D-12, D-14, D-15, D-16, D-21, D-22, D-23, or D-24 is more preferable, and D-21, D-22, D-23, or D-24 is further preferable in view of luminescent efficiency, and durability.

The luminescent dopant in a light-emitting layer is contained in an amount of 0.1% by mass to 30% by mass with respect to the total mass of the compounds generally forming the light-emitting layer, but it is preferably contained in an amount of 1% by mass to 15% by mass, and more preferably in an amount of 2% by mass to 12% by mass in view of durability and luminescent durability.

Although a thickness of the light-emitting layer is not particularly limited, 1 nm to 500 nm is usually preferred, and within this range, 5 nm to 200 nm is more preferable, and 5 nm to 100 nm is further preferred in view of luminescent efficiency.

(Host Material)

As the host materials to be used according to the present invention, positive hole transporting host materials excellent in positive hole transporting property (referred to as a "positive hole transporting host" in some cases) and electron transporting host compounds excellent in electron transporting property (referred to as an "electron transporting host" in some cases) may be used.

<<Positive Hole Transporting Host>>

The positive hole transporting host used for the organic layer of the present invention preferably has an ionization potential Ip of 5.1 eV to 6.3 eV, more preferably has an ionization potential of 5.4 eV to 6.1 eV, and further preferably has an ionization potential of 5.6 eV to 5.8 eV in view of improvements in durability and decrease in driving voltage. Furthermore, it preferably has an electron affinity Ea of 1.2 eV to 3.1 eV, more preferably of 1.4 eV to 3.0 eV, and further preferably of 1.8 eV to 2.8 eV in view of improvements in durability and decrease in driving voltage.

Specific examples of such positive hole transporting hosts as mentioned above include pyrrole, carbazole, triazole, oxazole, oxadiazole, pyrazole, imidazole, polyarylalkane, pyrazoline, pyrazolone, phenylenediamine, arylamine, amino-substituted chalcone, styrylanthracene, fluorenone, hydrazone, stilbene, silazane, aromatic tertiary amine compounds, styrylamine compounds, aromatic dimethylidine compounds, porphyrin compounds, polysilane compounds, poly(N-vinylcarbazole), aniline copolymers, electro-conductive high-molecular oligomers such as thiophene oligomers, polythiophenes and the like, organic silanes, carbon films, derivatives thereof, and the like.

Among these, carbazole derivatives, aromatic tertiary amine compounds, and thiophene derivatives are preferable, and particularly, compounds containing a plurality of carbazole skeletons and/or aromatic tertiary amine skeletons in a molecule are preferred.

As specific examples of the positive hole transporting hosts described above, the following compounds may be listed, but the present invention is not limited thereto.

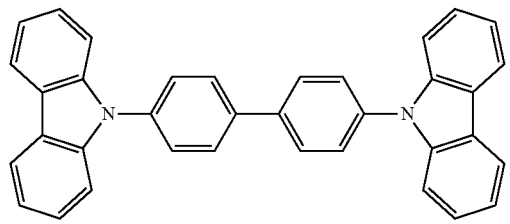

H-1

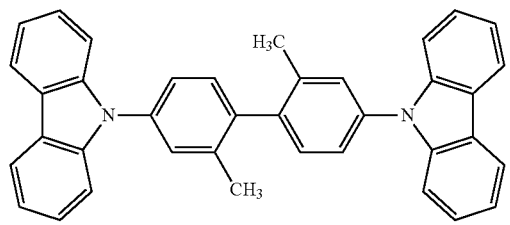

H-2

H-3
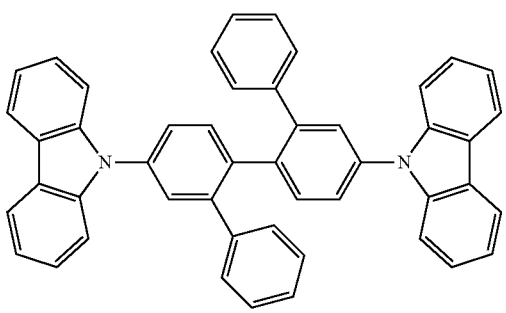
H-4
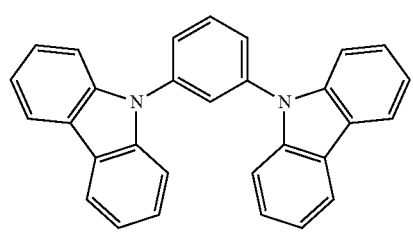
H-5
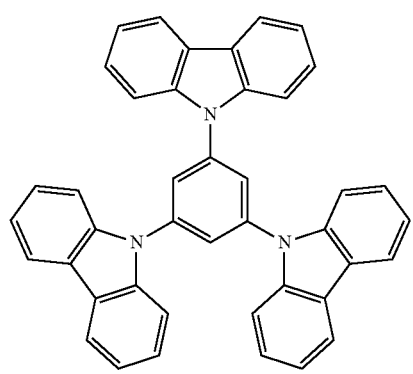
H-6
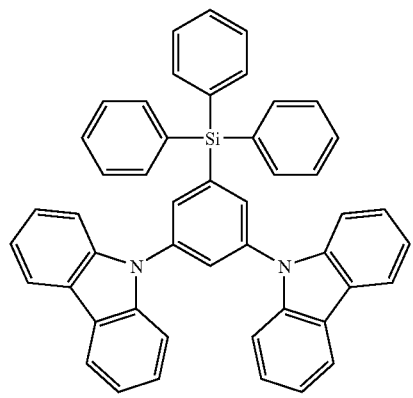
H-7
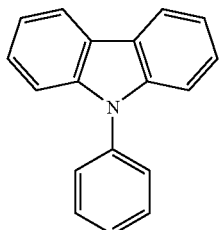
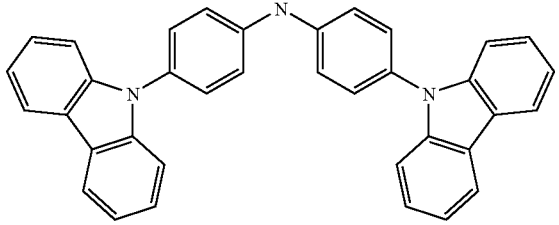
H-8
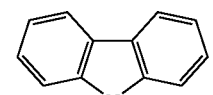
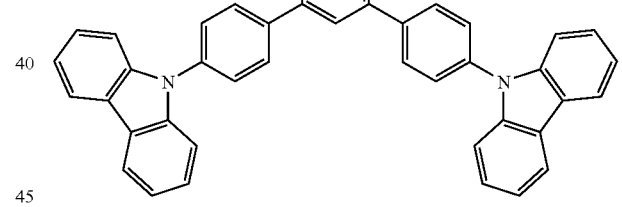
H-9
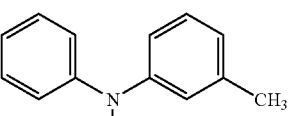
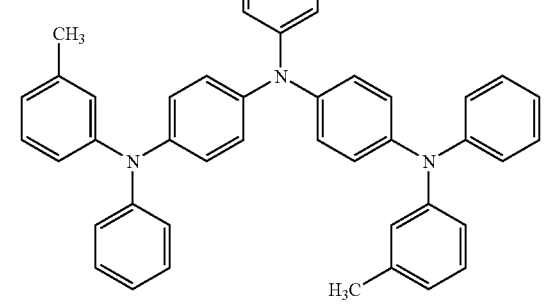

H-10
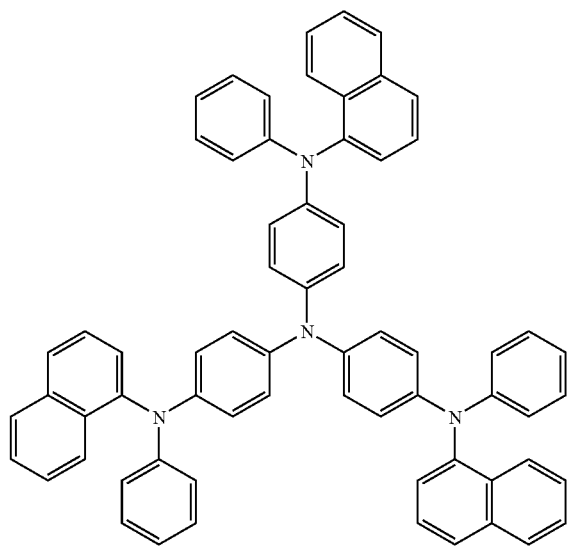
H-11
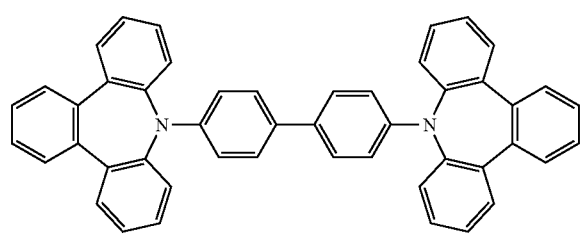
H-12
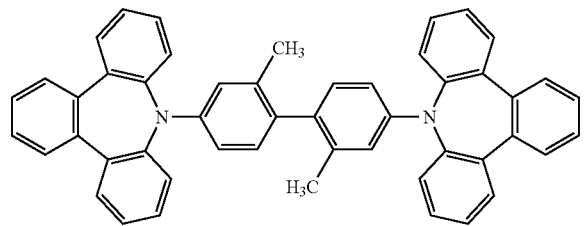
H-13
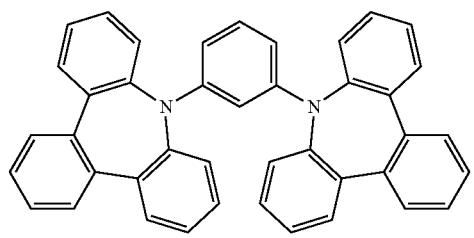
H-14
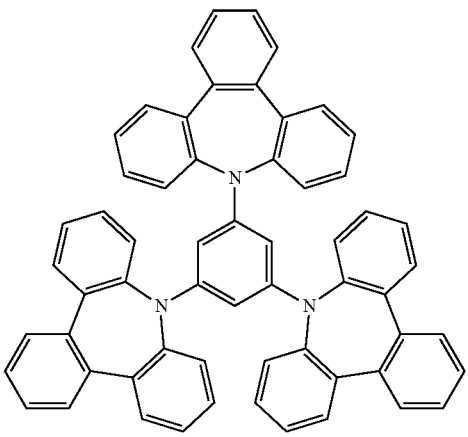
H-15
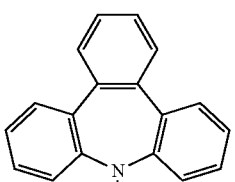
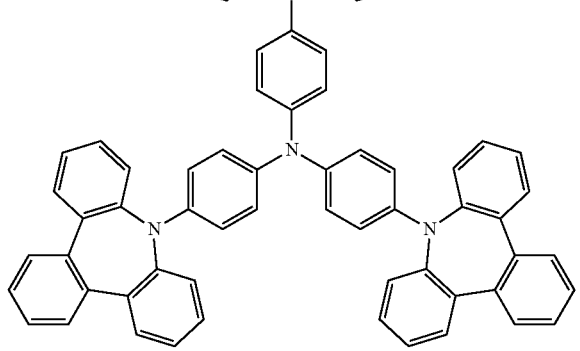
H-16
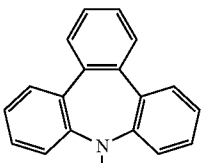
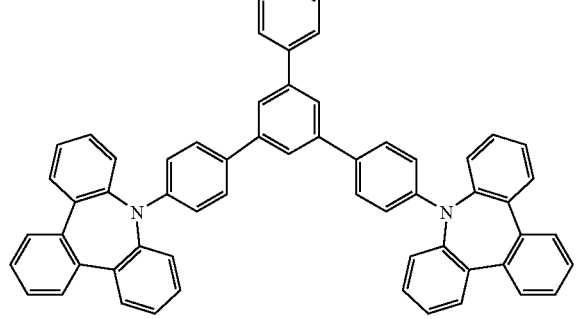

H-17
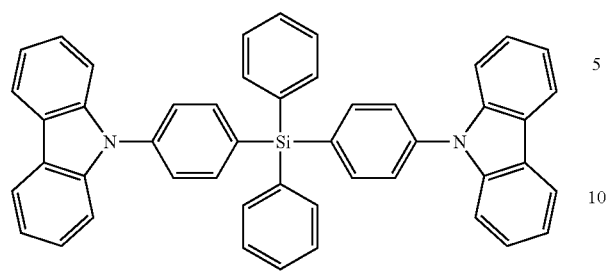
H-18
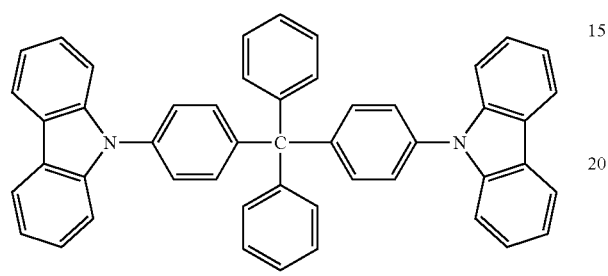
H-19
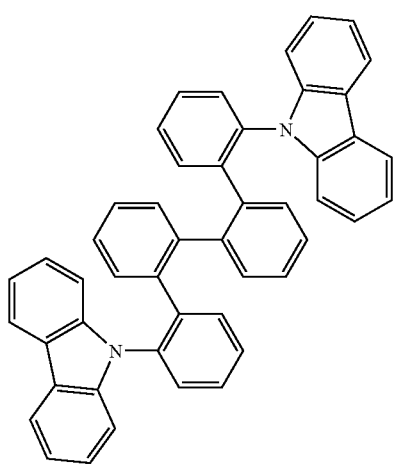
H-20
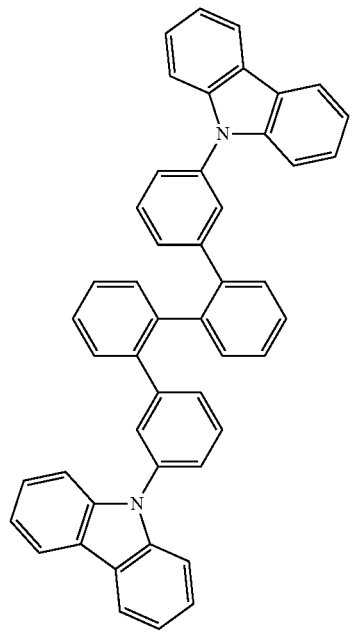
H-21
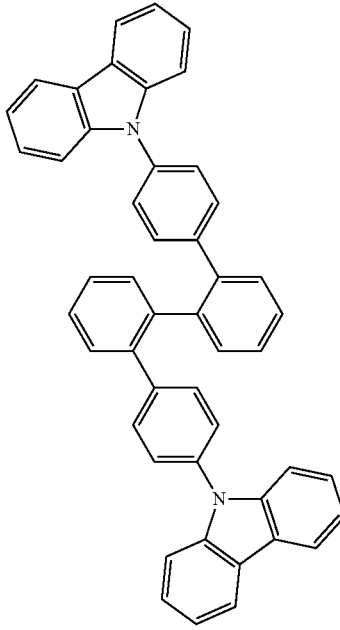
H-22 H-23
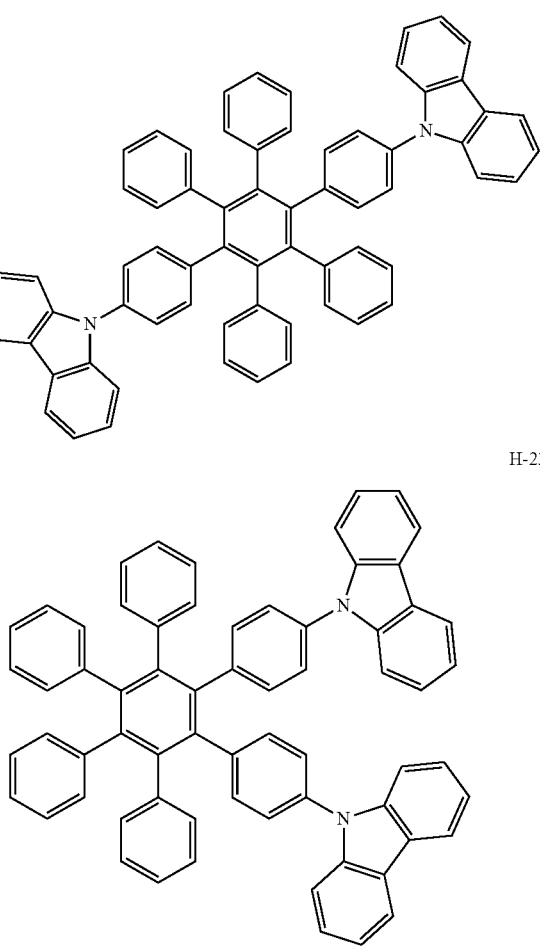
<<Electron Transporting Host>
As the electron transporting host used according to the present invention, it is preferred that an electron affinity Ea of the host is 2.5 eV to 3.5 eV, more preferably 2.6 eV to 3.2 eV, and further preferably 2.8 eV to 3.1 eV in view of improvements in durability and decrease in driving voltage. Furthermore, it is preferred that an ionization potential Ip of the host is 5.7 eV to 7.5 eV, more preferably 5.8 eV to 7.0 eV, and further preferably 5.9 eV to 6.5 eV in view of improvements in durability and decrease in driving voltage.

Specific examples of such electron transporting hosts as mentioned above include pyridine, pyrimidine, triazine, imidazole, pyrazole, triazole, oxazole, oxadiazole, fluorenone, anthraquinonedimethane, anthrone, diphenylquinone, thiopyrandioxide, carbodiimide, fluorenylidenemethane, distyrylpyradine, fluorine-substituted aromatic compounds, heterocyclic tetracarboxylic anhydrides such as naphthaleneperylene and the like, phthalocyanine, derivatives thereof (which may form a condensed ring with another ring), and a variety of metal complexes represented by metal complexes of 8-quinolynol derivatives, metal phthalocyanine, and metal complexes having benzoxazole or benzothiazole as the ligand.

Preferable electron transporting hosts are metal complexes, azole derivatives (benzimidazole derivatives, imidazopyridine derivatives and the like), and azine derivatives (pyridine derivatives, pyrimidine derivatives, triazine derivatives and the like). Among these, metal complexes are preferred according to the present invention in view of durability. As the metal complex compound, a metal complex containing a ligand having at least one nitrogen atom, oxygen atom, or sulfur atom to be coordinated with the metal is more preferable.

Although a metal ion in the metal complex is not particularly limited, a beryllium ion, a magnesium ion, an aluminum ion, a gallium ion, a zinc ion, an indium ion, a tin ion, a platinum ion, or a palladium ion is preferred; more preferable is a beryllium ion, an aluminum ion, a gallium ion, a zinc ion, a platinum ion, or a palladium ion; and further preferable is an aluminum ion, a zinc ion, or a palladium ion.

Although there are a variety of well-known ligands to be contained in the above-described metal complexes, examples thereof include ligands described in "Photochemistry and Photophysics of Coordination Compounds" authored by H. Yersin, published by Springer-Verlag Company in 1987; "YUHKI KINZOKU KAGAKU—KISO TO OUYOU— (Metalorganic Chemistry —Fundamental and Application—)" authored by Akio Yamamoto, published by Shokabo Publishing Co., Ltd. in 1982, and the like.

The ligands are preferably nitrogen-containing heterocyclic ligands (having preferably 1 to 30 carbon atoms, more preferably 2 to 20 carbon atoms, and particularly preferably 3 to 15 carbon atoms); and they may be a unidentate ligand or a bi- or higher-dentate ligand. Preferable are bi- to hexa-dentate ligands, and mixed ligands of bi- to hexa-dentate ligands with a unidentate ligand are also preferable.

Examples of the ligands include azine ligands (e.g. pyridine ligands, bipyridyl ligands, terpyridine ligands and the like); hydroxyphenylazole ligands (e.g. hydroxyphenylbenzimidazole ligands, hydroxyphenylbenzoxazole ligands, hydroxyphenylimidazole ligands, hydroxyphenylimidazopyridine ligands and the like); alkoxy ligands (those having preferably 1 to 30 carbon atoms, more preferably 1 to 20 carbon atoms, and particularly preferably 1 to 10 carbon atoms, examples of which include methoxy, ethoxy, butoxy, 2-ethylhexyloxy and the like); aryloxy ligands (those having preferably 6 to 30 carbon atoms, more preferably 6 to 20 carbon atoms, and particularly preferably 6 to 12 carbon atoms, examples of which include phenyloxy, 1-naphthyloxy, 2-naphthyloxy, 2,4,6-trimethylphenyloxy, 4-biphenyloxy and the like); heteroaryloxy ligands (those having preferably 1 to 30 carbon atoms, more preferably 1 to 20 carbon atoms, and particularly preferably 1 to 12 carbon atoms, examples of which include pyridyloxy, pyrazyloxy, pyrimidyloxy, quinolyloxy and the like); alkylthio ligands (those having preferably 1 to 30 carbon atoms, more preferably 1 to 20 carbon atoms, and particularly preferably 1 to 12 carbon atoms, examples of which include methylthio, ethylthio and the like); arylthio ligands (those having preferably 6 to 30 carbon atoms, more preferably 6 to 20 carbon atoms, and particularly preferably 6 to 12 carbon atoms, examples of which include phenylthio and the like); heteroarylthio ligands (those having preferably 1 to 30 carbon atoms, more preferably 1 to 20 carbon atoms, and particularly preferably 1 to 12 carbon atoms, examples of which include pyridylthio, 2-benzimidazolylthio, benzooxazolylthio, 2-benzothiazolylthio and the like); siloxy ligands (those having preferably 1 to 30 carbon atoms, more preferably 3 to 25 carbon atoms, and particularly preferably 6 to 20 carbon atoms, examples of which include a triphenylsiloxy group, a triethoxysiloxy group, a triisopropylsiloxy group and the like); aromatic hydrocarbon anion ligands (those having preferably 6 to 30 carbon atoms, more preferably 6 to 25 carbon atoms, and particularly preferably 6 to 20 carbon atoms, examples of which include a phenyl anion, a naphthyl anion, an anthranyl anion and the like anion); aromatic heterocyclic anion ligands (those having preferably 1 to 30 carbon atoms, more preferably 2 to 25 carbon atoms, and particularly preferably 2 to 20 carbon atoms, examples of which include a pyrrole anion, a pyrazole anion, a triazole anion, an oxazole anion, a benzoxazole anion, a thiazole anion, a benzothiazole anion, a thiophene anion, a benzothiophene anion and the like); indolenine anion ligands and the like. Among these, nitrogen-containing heterocyclic ligands, aryloxy ligands, heteroaryloxy groups, aromatic hydrocarbon anion ligands, aromatic heterocyclic anion ligands or siloxy ligands are preferable, and nitrogen-containing heterocyclic ligands, aryloxy ligands, siloxy ligands, aromatic hydrocarbon anion ligands, or aromatic heterocyclic anion ligands are more preferable.

Examples of the metal complex electron transporting hosts include compounds described, for example, in Japanese Patent Application Laid-Open Nos. 2002-235076, 2004-214179, 2004-221062, 2004-221065, 2004-221068, 2004-327313 and the like.

Specific examples of these electron transporting hosts include the following materials, but it should be noted that the present invention is not limited thereto.

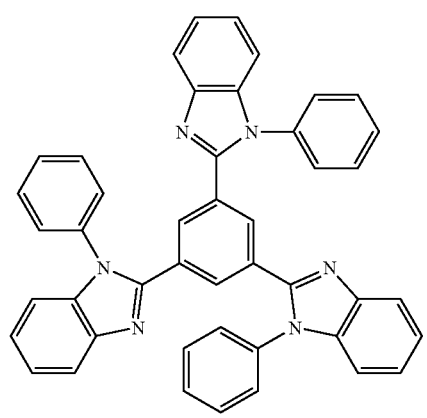

E-1

-continued
E-2
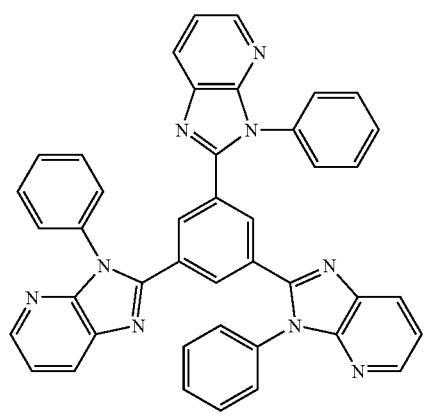
E-3
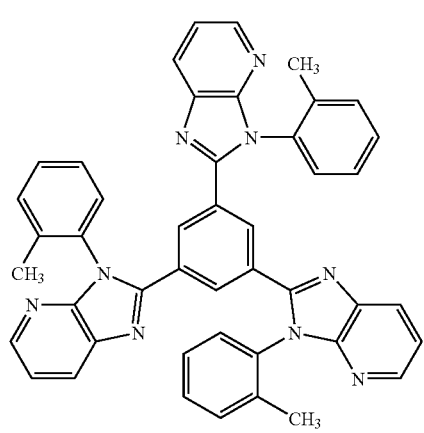
E-4
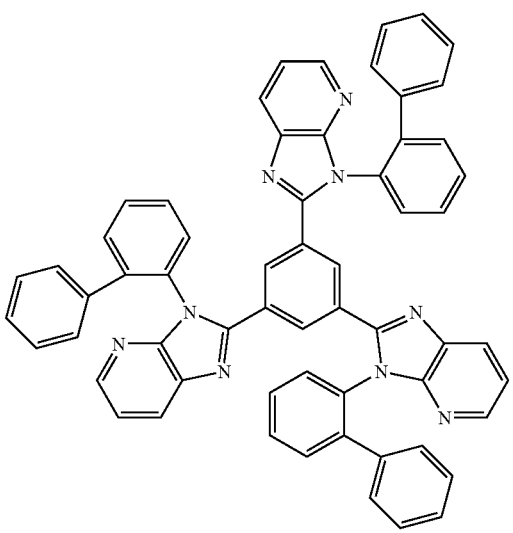
-continued
E-5
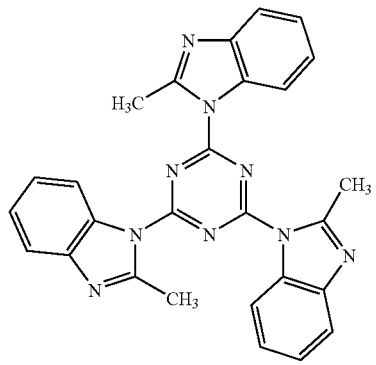
E-6
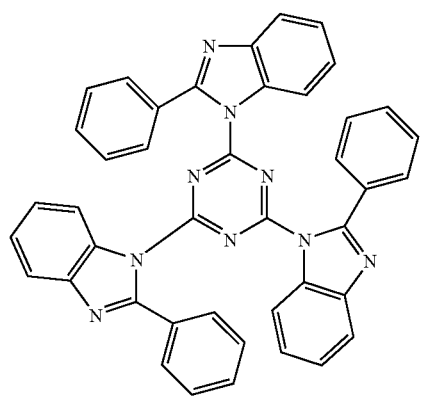
E-7
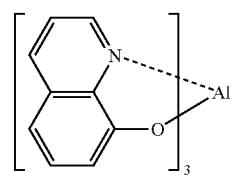
E-8
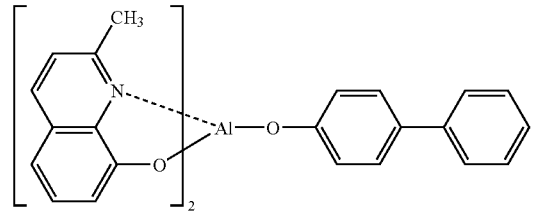
E-9
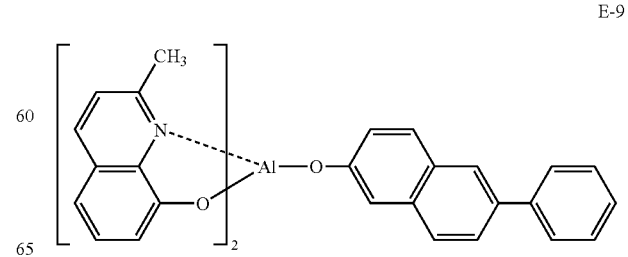

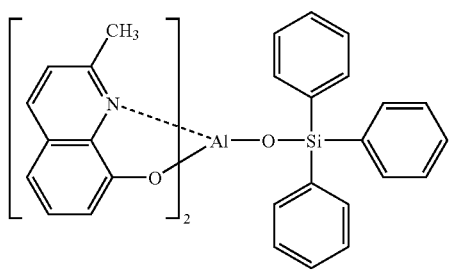
E-10
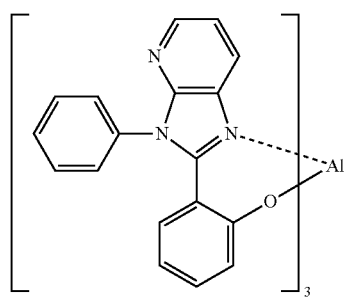
E-11
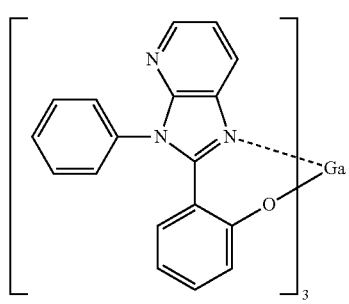
E-12
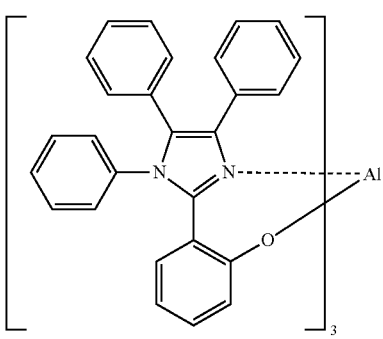
E-13
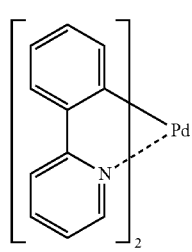
E-14
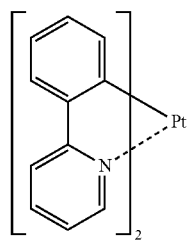
E-15
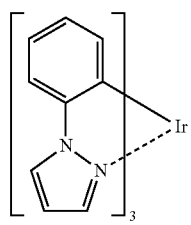
E-16
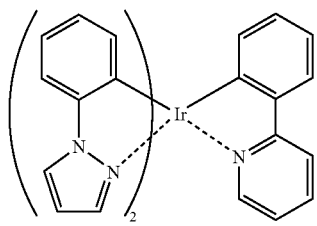
E-17
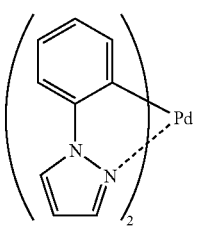
E-18
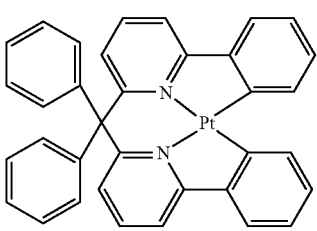
E-19
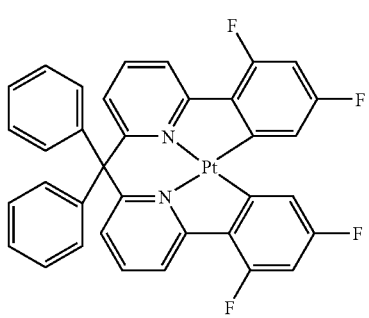
E-20

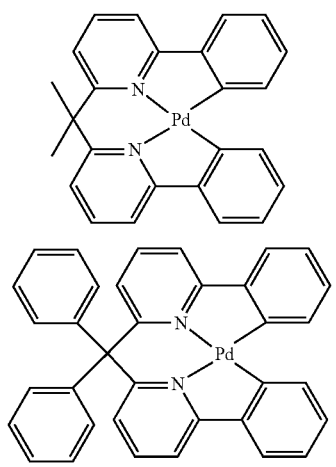

E-21

E-22

As the electron transportation hosts, E-1 to E-6, E-8, E-9, E-10, E-21, or E-22 is preferred, E-3, E-4, E-6, E-8, E-9, E-10, E-21, or E-22 is more preferred, and E-3, E-4, E-21, or E-22 is further preferred.

In the light-emitting layer of the present invention, it is preferred that when a phosphorescence luminescent dopant is used as the luminescent dopant, the lowest triplet excitation energy T1(D) in the phosphorescence luminescent dopant and the minimum value among the lowest triplet excitation energies T1(H)min in the plural host compounds satisfy the relationship of T1(H)min>T1(D) in view of color purity, luminescent efficiency, and driving durability.

Although a content of the host compounds according to the present invention is not particularly limited, it is preferably 15% by mass to 85% by mass with respect to the total mass of the compounds forming the light-emitting layer in view of luminescence efficiency and driving voltage.

A carrier mobility in the light-emitting layer is generally from $10^{-7}$ $cm^2.V^{-1}.s^{-1}$ to $10^{-1}$ $cm^2.V^{-1}.s^{-1}$, and within this range, it is preferably from $10^{-6}$ $cm^2.V^{-1}.s^{-1}$ to $10^{-1}$ $cm^2.V^{-1}.s^{-1}$, further preferably, from $10^{-5}$ $cm^2.V^{-1}.s^{-1}$ to $10^{-1}$ $cm^2.V^{-1}.s^{-1}$, and particularly preferably, from $10^{-4}$ $cm^2.V^{-1}.s^{-1}$ to $10^{-1}$ $cm^2.V^{-1}.s^{-1}$ in view of luminescence efficiency.

It is preferred that the carrier mobility of the light-emitting layer is lower than that of the carrier transportation layer, which will be mentioned herein below, in view of luminescence efficiency and driving durability.

The carrier mobility is measured in accordance with the "Time of Flight" method, and the resulting value is determined to be the carrier mobility.

(Positive Hole-Blocking Layer)

A positive hole-blocking layer is a layer having a function to prevent the positive holes transported from the anode to the light-emitting layer from passing through to the cathode side. According to the present invention, a positive hole-blocking layer may be provided as an organic compound layer adjacent to the light-emitting layer on the cathode side.

The positive hole-blocking layer is not particularly limited, but specifically, it may contain an aluminum complex such as bis-(2-methyl-8-quinonylphenolate)aluminium (which is referred to hereinafter as "BAlq" in some cases), a triazole derivative, a pyrazole derivative or the like.

It is preferred that a thickness of the positive hole-blocking layer is generally 50 nm or less in order to lower the driving voltage, more preferably it is 1 nm to 50 nm, and further preferably it is 5 nm to 40 nm.

(Electrode)

The anode and cathode electrodes in the present invention are a mirror surface having a high reflectance or is half-reflective and translucent as described above, depending on which is the face from which the emitted light is outgoing. Normally, the light is withdrawn from the anode face in the configuration of a so-called bottom-emission device, and from the cathode face in the configuration of a so-called top-emission device.

<Means for Making the Electrode Half-Reflective and Translucent>

The reflectance of the electrode can be adjusted by controlling the thickness thereof to within the favorable range according to the present invention.

The transmittance of electrode can be adjusted by controlling the thickness thereof to within the favorable range according to the present invention.

Examples of the materials for the half-reflective and translucent electrode include metal elements having a high work function such as platinum, gold, silver, chromium, tungsten and aluminum, and alloys thereof, and the thickness of the electrode in the lamination direction is preferably 5 nm or more and 50 nm or less. An example of the alloy material is, for example, an AgPdCu alloy containing silver as the principal component and palladium (Pd) and copper (Cu) respectively in amounts of 0.3% by mass to 1% by mass and 0.3% by mass to 1% by mass.

(Anode)

The anode may generally be any material as long as it has a function as an electrode for supplying positive holes to the organic compound layer, and there is no particular limitation as to the shape, the structure, the size or the like. However, it may be suitably selected from among well-known electrode materials according to the application and purpose of luminescent device. As mentioned above, the anode is usually provided as a transparent anode.

Materials for the anode may preferably include, for example, metals, alloys, metal oxides, electro-conductive compounds, and mixtures thereof, and those having a work function of 4.0 eV or more are preferred. Specific examples of the anode materials include electro-conductive metal oxides such as tin oxides doped with antimony, fluorine or the like (such as antimony-doped tin oxide (which is referred to hereinafter as "ATO" in some cases) or fluorine tin oxide (which is referred to hereinafter as "FTO" in some cases), tin oxide, zinc oxide, indium oxide, indium tin oxide (which is referred to hereinafter as "ITO" in some cases), and indium zinc oxide (which is referred to hereinafter as "IZO" in some cases); metals such as gold, silver, chromium, and nickel; mixtures or laminates of these metals and the electro-conductive metal oxides; inorganic electro-conductive materials such as copper iodide and copper sulfide; organic electro-conductive materials such as polyaniline, polythiophene, and polypyrrole; and laminates of these inorganic or organic electron-conductive materials with ITO. Among these, the electro-conductive metal oxides are preferred, and particularly, ITO is preferable in view of productivity, high electroconductivity, transparency and the like.

The anode may be formed on the substrate in accordance with a method which is appropriately selected from among wet methods such as printing methods, coating methods and the like; physical methods such as vacuum deposition methods, sputtering methods, ion plating methods and the like; and chemical methods such as CVD and plasma CVD methods and the like, in consideration of the suitability to a material constituting the anode. For instance, when ITO is selected as a material for the anode, the anode may be formed in accordance with a DC or high-frequency sputtering method, a vacuum deposition method, an ion plating method or the like.

In the organic electroluminescence device of the present invention, a position at which the anode is to be formed is not particularly limited, but it may be suitably selected according to the application and purpose of the luminescent device. The anode may be formed on either the whole surface or a part of the surface on either side of the substrate.

For patterning to form the anode, a chemical etching method such as photolithography, a physical etching method such as etching by laser, a method of vacuum deposition or sputtering through superposing masks, or a lift-off method or a printing method may be applied.

A thickness of the anode may be suitably selected according to the material constituting the anode and is therefore not definitely decided, but it is usually in the range of around 10 nm to 50 μm, and preferably 50 nm to 20 μm.

A value of resistance of the anode is preferably $10^3$ Ω/□ or less, and $10^2$ Ω/□ or less is more preferable.

(Cathode)

The cathode may generally be any material as long as it has a function as an electrode for injecting electrons to the organic compound layer, and there is no particular limitation as to the shape, the structure, the size or the like. However it may be suitably selected from among well-known electrode materials according to the application and purpose of the luminescent device.

Materials constituting the cathode may include, for example, metals, alloys, metal oxides, electro-conductive compounds, and mixtures thereof, and materials having a work function of 4.5 eV or less are preferred. Specific examples thereof include alkali metals (e.g., Li, Na, K, Cs or the like), alkaline earth metals (e.g., Mg, Ca or the like), gold, silver, lead, aluminum, sodium-potassium alloys, lithium-aluminum alloys, magnesium-silver alloys, rare earth metals such as indium, and ytterbium, and the like. They may be used alone, but it is preferred that two or more of them are used in combination from the viewpoint of satisfying both stability and electron injectability.

Among these, as the materials for constituting the cathode, alkaline metals or alkaline earth metals are preferred in view of electron injectability, and materials containing aluminum as a major component are preferred in view of excellent preservation stability.

The term "material containing aluminum as a major component" refers to a material constituted by aluminum alone; alloys comprising aluminum and 0.01% by mass to 10% by mass of an alkaline metal or an alkaline earth metal; or the mixtures thereof (e.g., lithium-aluminum alloys, magnesium-aluminum alloys and the like).

Regarding materials for the cathode, they are described in detail in JP-A Nos. 2-15595 and 5-121172, of which are incorporated by reference herein.

A method for forming the cathode is not particularly limited, but it may be formed in accordance with a well-known method.

For instance, the cathode may be formed in accordance with a method which is appropriately selected from among wet methods such as printing methods, coating methods and the like; physical methods such as vacuum deposition methods, sputtering methods, ion plating methods and the like; and chemical methods such as CVD and plasma CVD methods and the like, in consideration of the suitability to a material constituting the cathode. For example, when a metal (or metals) is (are) selected as a material (or materials) for the cathode, one or two or more of them may be applied at the same time or sequentially in accordance with a sputtering method or the like.

For patterning to form the cathode, a chemical etching method such as photolithography, a physical etching method such as etching by laser, a method of vacuum deposition or sputtering through superposing masks, or a lift-off method or a printing method may be applied.

In the present invention, a position at which the cathode is to be formed is not particularly limited, and it may be formed on either the whole or a part of the organic compound layer.

Furthermore, a dielectric material layer made of fluorides, oxides or the like of an alkaline metal or an alkaline earth metal may be inserted in between the cathode and the organic compound layer with a thickness of 0.1 nm to 5 nm. The dielectric layer may be considered to be a kind of electron injection layer. The dielectric material layer may be formed in accordance with, for example, a vacuum deposition method, a sputtering method, an ion-plating method or the like.

A thickness of the cathode may be suitably selected according to materials for constituting the cathode and is therefore not definitely decided, but it is usually in the range of around 10 nm to 5 μm, and preferably 50 nm to 1 μm.

(Substrate)

According to the present invention, a substrate may be applied. The substrate to be applied is preferably one which does not scatter or attenuate light emitted from the organic compound layer. Specific examples of materials for the substrate include zirconia-stabilized yttrium (YSZ); inorganic materials such as glass; polyesters such as polyethylene terephthalate, polybutylene phthalate, and polyethylene naphthalate; and organic materials such as polystyrene, polycarbonate, polyethersulfon, polyarylate, polyimide, polycycloolefin, norbornene resin, poly(chlorotrifluoroethylene), and the like.

For instance, when glass is used as the substrate, non-alkali glass is preferably used with respect to the quality of material in order to decrease ions eluted from the glass. In the case of employing soda-lime glass, it is preferred to use glass on which a barrier coat such as silica has been applied. In the case of employing an organic material, it is preferred to use a material excellent in heat resistance, dimension stability, solvent resistance, electrical insulation, and workability.

There is no particular limitation as to the shape, the structure, the size or the like of the substrate, but it may be suitably selected according to the application, purposes and the like of the luminescent device. In general, a plate-like substrate is preferred as the shape of the substrate. A structure of the substrate may be a monolayer structure or a laminated structure. Furthermore, the substrate may be formed from a single member or two or more members.

Although the substrate may be in a transparent and colorless, or a transparent and colored condition, it is preferred that the substrate is transparent and colorless from the viewpoint that the substrate does not scatter or attenuate light emitted from the organic light-emitting layer.

A moisture permeation preventive layer (gas barrier layer) may be provided on the front surface or the back surface of the substrate.

For a material of the moisture permeation preventive layer (gas barrier layer), inorganic substances such as silicon nitride and silicon oxide may be preferably applied. The moisture permeation preventive layer (gas barrier layer) may be formed in accordance with, for example, a high-frequency sputtering method or the like.

In the case of applying a thermoplastic substrate, a hard-coat layer or an under-coat layer may be further provided as needed.

(Protective Layer)

According to the present invention, the whole organic EL device may be protected by a protective layer.

A material contained in the protective layer may be one having a function to prevent penetration of substances such as moisture and oxygen, which accelerate deterioration of the device, into the device.

Specific examples thereof include metals such as In, Sn, Pb, Au, Cu, Ag, Al, Ti, Ni and the like; metal oxides such as MgO, SiO, $SiO_2$, $Al_2O_3$, GeO, NiO, CaO, BaO, $Fe_2O_3$, $Y_2O_3$, $TiO_2$ and the like; metal nitrides such as $SiN_x$, $SiN_xO_y$ and the like; metal fluorides such as $MgF_2$, LiF, $AlF_3$, $CaF_2$ and the like; polyethylene; polypropylene; polymethyl methacrylate; polyimide; polyurea; polytetrafluoroethylene; polychlorotrifluoroethylene; polydichlorodifluoroethylene; a copolymer of chlorotrifluoroethylene and dichlorodifluoroethylene; copolymers obtained by copolymerizing a monomer mixture containing tetrafluoroethylene and at least one comonomer; fluorine-containing copolymers each having a cyclic structure in the copolymerization main chain; water-absorbing materials each having a coefficient of water absorption of 1% or more; moisture permeation preventive substances each having a coefficient of water absorption of 0.1% or less; and the like.

There is no particular limitation as to a method for forming the protective layer. For instance, a vacuum deposition method, a sputtering method, a reactive sputtering method, an MBE (molecular beam epitaxial) method, a cluster ion beam method, an ion plating method, a plasma polymerization method (high-frequency excitation ion plating method), a plasma CVD method, a laser CVD method, a thermal CVD method, a gas source CVD method, a coating method, a printing method, or a transfer method may be applied.

(Sealing)

The whole organic electroluminescence device of the present invention may be sealed with a sealing cap.

Furthermore, a moisture absorbent or an inert liquid may be used to seal a space defined between the sealing cap and the luminescent device. Although the moisture absorbent is not particularly limited. Specific examples thereof include barium oxide, sodium oxide, potassium oxide, calcium oxide, sodium sulfate, calcium sulfate, magnesium sulfate, phosphorus pentoxide, calcium chloride, magnesium chloride, copper chloride, cesium fluoride, niobium fluoride, calcium bromide, vanadium bromide, molecular sieve, zeolite, magnesium oxide and the like. Although the inert liquid is not particularly limited, specific examples thereof include paraffins; liquid paraffins; fluorine-based solvents such as perfluoroalkanes, perfluoroamines, perfluoroethers and the like; chlorine-based solvents; silicone oils; and the like.

In the organic electroluminescence device of the present invention, when a DC (AC components may be contained as needed) voltage (usually 2 volts to 40 volts) or DC is applied across the anode and the cathode, luminescence can be obtained.

For the driving method of the organic electroluminescence device of the present invention, driving methods described in JP-A Nos. 2-148687, 6-301355, 5-29080, 7-134558, 8-234685, and 8-241047; Japanese Patent No. 2784615, U.S. Pat. Nos. 5,828,429 and 6,023,308 are applicable.

(Application of the Organic Electroluminescence Device of the Present Invention)

The organic electroluminescence device of the present invention can be appropriately used for indicating elements, displays, backlights, electronic photographs, illumination light sources, recording light sources, exposure light sources, reading light sources, signages, advertising displays, interior accessories, optical communications and the like.

EXAMPLES

Hereinafter, the organic electroluminescence device according to the present invention will be described with reference to Examples, but it should be understood that the invention is not restricted by these Examples.

Example 1

1. Preparation of Organic EL Device

A glass substrate having a thickness of 0.7 mm was subjected to ultrasonic cleaning in 2-propanol and treated with UV and ozone for 20 minutes. Then, aluminum was deposited thereon as an anode by vacuum deposition to a thickness of 60 nm, and organic layers were deposited sequentially thereon by vapor deposition, to prepare a laminate having two emission units in the following configuration.

<Basic Structure of Device>

"glass substrate/anode: Al (60 nm)/light emission unit A/n-doped layer/alkali metal layer/layer containing hole transport material/p-doped layer/light emission unit B/cathode: Ag (15 nm)"

The light emission unit A: a laminate formed by a N,N'-dinaphthyl-N,N'-diphenyl-[1,1'-biphenyl]-4,4'-diamine (which is referred to hereinafter as "α-NPD" in some cases) layer deposited at the thickness of 10 nm as a hole transport layer/a co-deposited layer of 4,4'-di-(N-carbazole)-biphenyl (which is referred to hereinafter as "CBP" in some cases) and 1,3,6,8-tetra-(4-biphenyl)-pyrene (which is referred to hereinafter as "tbppy" in some cases) in an amount of 12% by mass with respect to CBP as a light emission layer/an tri-(8-hydroxy-quinonynate) aluminium (which is referred to hereinafter as "Alq" in some cases) layer deposited at the thickness of 10 nm as an electron transport layer.

The light emission unit B: a laminate formed by a α-NPD layer deposited at the thickness of 10 nm as a hole transport layer/a co-deposited layer of CBP and tbppy in an amount of 12% by mass with respect to CBP as a light emission layer/an Alq layer deposited at the thickness of 20 nm as an electron transport layer.

Compositions of the n-doped layer, the alkali metal layer, the layer containing the hole transport layer and the n-doped layer are shown in Table 1. All of these layers were formed by an evaporation deposition method.

In the table, for example, a/b indicates that the layer a and the layer b were respectively deposited and thus laminated, and c+d indicates that the two materials c and d were co-deposited so as to obtain an indicated thickness or an amount indicated with an unit of % by mass.

An emission area of 2 mm×2 mm in size was prepared by masked deposition.

2. Evaluation of Performance

1) Evaluation Points

<<Light Emission Efficiency>>

A DC voltage was applied to the thus prepared EL device to emit light, using a Source Measure Unit Model 2400 manufactured by KEITHLEY. The emission spectrum was measured by using a Multi-Channel Analyzer PMA-11 manufactured by Hamamatsu Photonics Co. Luminance was measured using an Luminance Meter BM-8 manufactured by Topcon Co., and external quantum efficiency was calculated by the waveform of the emission spectrum, current and luminance (15 $mA/m^2$) upon measurement.

<<Electric Resistance>>

Electric resistance is determined by measuring a voltage between the anode and the cathode at a specified electric current during light emitting, and, disregarding the electric resistances of Ag and Al used as the electrode materials as sufficiently small, by calculating according to an equation that (resistance [Ω])=(measured voltage [V] between anode and cathode)÷(current [A]).

—Measuring Method—

A volt-meter (Digital Multimeter TR6847, manufactured by Advantest Corp.) is connected between the anode and the cathode, and a voltage therebetween and an electric current from a constant current source (Programmable DC Voltage-Current Generator R6144, manufactured by Advantest Corp.) are measured.

<<Unevenness in Luminance>>

An evaluation was made by preparing devices, identical in the device structure to those of Examples except for changing the anode (Al) and the cathode (Ag) to ITO (10 Ω/sq., 150 nm) for the anode and Al (100 nm) for the cathode, and also changing the light emission area. In the light emission area of 13 cm×15 cm, a light emission luminance in an edge portion of the ITO electrode, which constitutes a brightest portion, at 10 mA/mm$^2$ was designated as 100%, while a relative light emission luminance in a central portion of the ITO electrode, which constitutes a darkest portion, was designated as X %, and unevenness in luminance was defined by such X %.

Criteria for evaluation:
◎: X>50%
○: X being within a range of from 50 to 40%.
X: X<40%.

2) Results

The obtained results are shown in Table 2.

Device Nos. 1 to 3 of the present invention had a high external quantum yield, and was reduced unevenness in luminance. The devices of the invention are featured by a high external quantum yield in spite of a high electric resistance.

On the other hand, comparative device Nos. 4 and 5, in which the n-doped layer and the p-doped layer were in direct contact, had a low electric resistance and were inferior in unevenness of luminance.

A comparative device No. 6, which does not include the layer containing the hole transport material, had a low external quantum yield.

A comparative device No. 7, which does not include the alkali metal layer, had a low electric resistance, but could not reduce unevenness in luminance and had a low external quantum yield.

A comparative device No. 8, utilizing a co-deposited layer of Li and 2-TNATA, had a high electric resistance and exhibited an improvement in unevenness in luminance, but exhibited a decrease in the external quantum yield.

TABLE 2

| Device No. | External Quantum Efficiency (%) | Electric Resistance (kΩ) | Unevenness in Luminance | Remarks |
|---|---|---|---|---|
| 1 | 7.1 | 49 | ◎ | Invention |
| 2 | 5.9 | 35 | ○ | Invention |
| 3 | 6.4 | 55 | ◎ | Invention |
| 4 | 5.1 | 23 | X | Comparative |
| 5 | 5.5 | 21 | X | Comparative |
| 6 | 5.1 | 32 | ○ | Comparative |
| 7 | 5.4 | 23 | X | Comparative |
| 8 | 3.4 | 41 | ○ | Comparative |

What is claimed is:

1. An organic electroluminescence device of multi-photon emission mode which comprises plural light emission layers and at least one charge generation layer between a pair of electrodes, arranged in a film thickness direction thereof, wherein the charge generation layer includes at least one p-doped layer and at least one n-doped layer, and further includes an alkali metal layer consisting of an alkali metal and a layer containing a hole transport material between the p-doped layer and the n-doped layer;
wherein the layer containing a hole transport material is not doped with a p-dopant, the p-doped layer is located next to the layer containing a hole transport material, and the layer containing a hole transport material directly contacts the alkali metal layer.

2. An organic electroluminescence device according to claim 1, wherein the charge generation layer includes the n-doped layer, the alkali metal layer, the layer containing the hole transport material and the p-doped layer arranged in this order.

3. An organic electroluminescence device according to claim 1, wherein the alkali metal layer is Li, Na, K, Rb or Cs.

4. An organic electroluminescence device according to claim 3, wherein the alkali metal layer is Li.

5. An organic electroluminescence device according to claim 1, wherein the layer containing the hole transport material contains an aromatic tertiary amine compound.

6. An organic electroluminescence device according to claim 5, wherein the layer containing the hole transport material contains 4,4',4"-tri-(2-naphthylphenylamino)-triphenylamine.

7. An organic electroluminescence device according to claim 6, wherein the alkali metal layer is Li.

TABLE 1

| Device No. | n-doped Layer | Alkali Metal layer | Layer Containing Hole Transport Material | p-doped Layer | Remarks |
|---|---|---|---|---|---|
| 1 | Alq (10 nm)/(LiF (0.5 nm) + Al (1.5 nm)) | Li (1 nm) | 2-TNATA (10 nm) | 2-TNATA (10 nm) + MoO$_3$ (30% by mass) | Invention |
| 2 | Alq (10 nm)/(LiF (0.5 nm) + Al (1.5 nm))/ 2-TNATA (5 nm) | Li (1 nm) | 2-TNATA (5 nm) | 2-TNATA (10 nm) + MoO$_3$ (30% by mass) | Invention |
| 3 | Alq (10 nm) + Li (1% by mass) | Li (1 nm) | 2-TNATA (10 nm) | 2-TNATA (10 nm) + MoO$_3$ (30% by mass) | Invention |
| 4 | Alq (10 nm)/(LiF (0.5 nm) + Al (1.5 nm)) | — | — | 2-TNATA (21 nm) + MoO$_3$ (30% by mass) | Comparative |
| 5 | Alq (10 nm)/(LiF (0.5 nm) + Al (1.5 nm)) | — | — | 2-TNATA (21 nm) + F4-TCNQ (0.1% by mass) | Comparative |
| 6 | Alq (10 nm)/(LiF (0.5 nm) + Al (1.5 nm)) | Li (1 nm) | — | 2-TNATA (20 nm) + MoO$_3$ (30% by mass) | Comparative |
| 7 | Alq (10 nm)/(LiF (0.5 nm) + Al (1.5 nm)) | — | 2-TNATA (10 nm) | 2-TNATA (17 nm) + MoO$_3$ (30% by mass) | Comparative |
| 8 | Alq (10 nm)/(LiF (0.5 nm) + Al (1.5 nm))/ (2-TNATA (21 nm) + Li (1% by mass)) | — | — | — | Comparative |

8. An organic electroluminescence device according to claim 1, wherein the p-doped layer contains an arylamine compound represented by the following formula (I):

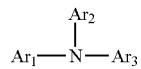

Formula (I)

wherein Ar1, Ar2 and Ar3 each independently represent an aromatic hydrocarbon group that may have a substituent.

9. An organic electroluminescence device according to claim 8, wherein the arylamine compound represented by the formula (I) has a glass transition point of 90° C. or higher.

10. An organic electroluminescence device according to claim 1, wherein the p-doped layer contains $V_2O_5$, $Re_2O_7$, F4-TCNQ, or $MoO_3$.

11. An organic electroluminescence device of multi-photon emission mode which comprises plural light emission layers and at least one charge generation layer between a pair of electrodes, arranged in a film thickness direction thereof, wherein the charge generation layer includes at least one p-doped layer and at least one n-doped layer, and further includes an alkali metal layer consisting of an alkali metal and a layer consisting of a hole transport material between the p-doped layer and the n-doped layer;

wherein the p-doped layer is located next to the layer consisting of a hole transport material, and the layer consisting of a hole transport material directly contacts the alkali metal layer.

* * * * *